(12) United States Patent
Skidmore et al.

(10) Patent No.: US 7,622,717 B2
(45) Date of Patent: Nov. 24, 2009

(54) PIXEL STRUCTURE HAVING AN UMBRELLA TYPE ABSORBER WITH ONE OR MORE RECESSES OR CHANNELS SIZED TO INCREASE RADIATION ABSORPTION

(75) Inventors: George D. Skidmore, Richardson, TX (US); Christopher G. Howard, Dallas, TX (US)

(73) Assignee: DRS Sensors & Targeting Systems, Inc., Dallas, TX (US)

( * ) Notice: Subject to any disclaimer, the term of this patent is extended or adjusted under 35 U.S.C. 154(b) by 41 days.

(21) Appl. No.: 11/949,367

(22) Filed: Dec. 3, 2007

(65) Prior Publication Data

US 2009/0140147 A1    Jun. 4, 2009

(51) Int. Cl.
*H01L 31/00* (2006.01)
(52) U.S. Cl. .................................. 250/338.1
(58) Field of Classification Search ........... 250/338.1
See application file for complete search history.

(56) References Cited

U.S. PATENT DOCUMENTS

| | | | |
|---|---|---|---|
| 3,619,614 A | 11/1971 | Yamaka | |
| 5,010,251 A | 4/1991 | Grinberg | |
| 5,286,976 A | 2/1994 | Cole | |
| 5,288,649 A | 2/1994 | Keenan | |
| 5,367,167 A | 11/1994 | Keenan | |
| RE36,706 E | 2/1996 | Cole | |
| 5,584,117 A | 12/1996 | Lee | |
| 5,602,393 A * | 2/1997 | Gerard | 250/338.4 |
| 5,629,521 A | 5/1997 | Leet | |
| 5,698,852 A | 12/1997 | Tanaka | |
| 5,713,763 A | 2/1998 | Schwarz | |
| 5,801,383 A | 9/1998 | Wada et al. | |
| 5,912,464 A * | 6/1999 | Vilain et al. | 250/338.4 |
| 5,962,854 A | 10/1999 | Endo | |
| 6,097,031 A * | 8/2000 | Cole | 250/370.06 |
| 6,144,030 A | 11/2000 | Ray | |
| 6,194,722 B1 * | 2/2001 | Fiorini et al. | 250/338.1 |
| 6,198,099 B1 | 3/2001 | Kim | |
| 6,307,194 B1 | 10/2001 | Fitzgibbons et al. | |

(Continued)

OTHER PUBLICATIONS

An International Search Report for counterpart International Application No. PCT/US08/73997 dated Nov. 3, 2008.

*Primary Examiner*—David P Porta
*Assistant Examiner*—Shun Lee
(74) *Attorney, Agent, or Firm*—Sonnenschein Nath & Rosenthal LLP

(57) ABSTRACT

A pixel structure for use in an infrared imager is provided. The pixel structure includes a substrate and a bolometer. The bolometer includes a transducer that has a spaced apart relationship with respect to the substrate and has an electrical resistance that varies in response to changes in the temperature of the transducer. The bolometer also includes an absorber that has a spaced apart relationship with respect to the transducer and has a thermal connection to the transducer permitting radiation absorbed by the absorber to heat the transducer. The absorber has a top side defining a recess or channel in the absorber. The recess or channel is adapted to effect the propagation path of a portion of radiation received by the absorber such that the radiation portion is absorbed by the absorber rather than exiting the absorber. The recess or channel also decreases the thermal mass of the bolometer.

15 Claims, 3 Drawing Sheets

U.S. PATENT DOCUMENTS

| | | |
|---|---|---|
| 6,448,557 B2 | 9/2002 | Oda |
| 6,468,402 B1 | 10/2002 | Vanderstraeten |
| 6,489,613 B1 | 12/2002 | Mori |
| 6,507,021 B1 | 1/2003 | Brood |
| 6,552,344 B1 | 4/2003 | Sone |
| 6,690,014 B1 | 2/2004 | Gooch |
| 6,717,147 B2 | 4/2004 | Oda |
| 6,777,681 B1 | 8/2004 | Schimert |
| 6,787,387 B2 | 9/2004 | Ikushima |
| 6,806,470 B2 | 10/2004 | Iida |
| 2001/0010360 A1 | 8/2001 | Oda |
| 2002/0005485 A1 | 1/2002 | Hashimoto |
| 2002/0040967 A1 | 4/2002 | Oda |
| 2002/0175284 A1 | 11/2002 | Vilain |
| 2003/0025078 A1 | 2/2003 | Yamaguchi |
| 2003/0062480 A1 | 4/2003 | Kanzaki |
| 2003/0141453 A1 | 7/2003 | Reed |
| 2003/0168598 A1 | 9/2003 | Oda |
| 2003/0183921 A1 | 10/2003 | Komobuchi |
| 2003/0209668 A1 | 11/2003 | Tohyama |
| 2004/0089807 A1 | 5/2004 | Wada |
| 2004/0129882 A1 | 7/2004 | Mashio |
| 2004/0173751 A1 | 9/2004 | Komobuchi |
| 2004/0207288 A1 | 10/2004 | Funakubo |
| 2005/0017276 A1 | 1/2005 | Ikushima |

\* cited by examiner

PIXEL STRUCTURE HAVING AN UMBRELLA TYPE ABSORBER WITH ONE OR MORE RECESSES OR CHANNELS SIZED TO INCREASE RADIATION ABSORPTION

FIELD OF THE INVENTION

The present invention relates generally to infrared detectors and associated fabrication methods and, more particularly, to the pixel structure of a bolometer-based focal plane array and associated fabrication methods.

BACKGROUND OF THE INVENTION

Infrared detectors are used in a variety of applications to provide an electrical output which is a useful measure of the incident infrared radiation. For example, quantum detectors are one type of infrared detector that are often used for night vision purposes in a variety of military, industrial and commercial applications. Quantum detectors generally operate at cryogenic temperatures and therefore require a cryogenic cooling apparatus. As a result, quantum detectors that operate at cryogenic temperatures can have a relatively complex design and generally consume significant amounts of energy.

Another type of infrared detector is a thermal detector. Thermal detectors are typically uncooled and therefore generally operate at room temperature. One type of thermal detector that has been developed and is becoming increasingly popular is a microbolometer-based, uncooled focal plane array. A focal plane array generally includes a plurality of pixel structures, each of which include a bolometer disposed upon a common substrate. Each bolometer includes a transducer element that has an electrical resistance that varies as a result of temperature changes produced by the incident infrared radiation. By detecting changes in the electrical resistance, a measure of the incident infrared radiation can be obtained. Since the design of a bolometer-based uncooled focal plane array is generally less complex than cryogenically cooled quantum detectors and since these uncooled focal plane arrays generally require significantly less energy than cryogenically cooled quantum detectors, bolometer-based uncooled focal plane arrays are being increasingly utilized.

Each pixel structure of a conventional uncooled focal plane array has a bolometer that includes an absorber element for absorbing infrared radiation and an associated transducer element having an electrical resistance that varies as its temperature correspondingly varies. Although the absorber and transducer elements can be separate layers of a multilayer structure, the absorber element and the transducer element may sometimes be the same physical element.

In operation, infrared radiation incident upon the absorber element will heat the absorber element. Since the absorber element and the transducer element are in thermal contact, the heating of the absorber element will correspondingly heat the transducer element, thereby causing the electrical resistance of the transducer element to change in a predetermined manner. By measuring the change in electrical resistance of the transducer element, such as by passing a known current through the transducer element, a measure of the incident radiation can be obtained.

In order to permit the bolometer to be responsive to changes in the incident infrared radiation, the bolometer is generally designed to minimize thermal loss to the substrate. Thus, the bolometers of conventional focal plane arrays have separated the absorber and the transducer elements from the substrate so as to substantially thermally decouple the relatively massive substrate from the pixel. In this regard, each bolometer generally includes two or more legs that support the absorber and transducer elements above the substrate. The legs can extend between the absorber and transducer elements and the substrate, or the legs can connect the absorber and transducer elements to pillars or the like that support the absorber and transducer elements above the substrate.

In order to provide thermal contact between the absorber and the transducer elements while electrically insulating the transducer element from the absorber element, the bolometer also generally includes a thermally conductive, electrically insulating layer disposed between the absorber element and the transducer element. In addition, the bolometer typically includes another insulating layer disposed on the surface of the bolometer facing the substrate which serves to structurally support the other layers and to protect the other layers during the fabrication process. See, for example, U.S. Pat. Nos. 5,286,976; 5,288,649; 5,367,167 and 6,307,194 which describe the pixel structures of conventional bolometer-based focal plane arrays, the contents of each of which are incorporated herein by reference.

In order to further improve the performance of conventional pixel structures, each bolometer can include a reflector disposed upon the surface of the substrate underlying the absorber and transducer elements. As such, infrared radiation that is incident upon the bolometer, but that passes through and is not absorbed by the absorber element, will be reflected by the reflector back towards the absorber element. At least a portion of the reflected radiation will therefore be absorbed by the absorber element during its second pass through the absorber element, thereby increasing the percentage of the incident radiation that is absorbed by the absorber element.

However, the pixel structure of conventional bolometer-based focal plane arrays, such as disclosed in U.S. Pat. No. 6,307,194, still allow a substantial percentage of reflected radiation to pass through and exit the absorber without being absorbed. Moreover, in conventional bolometer-based focal plane arrays, the absorber has a resistive absorption layer that has a typical thickness of 50 Angstroms or more using current fabrication and deposition techniques. Accordingly, the absorber in conventional bolometer-based focal plane arrays has a resistivity of 200-350 ohms per square, which limits the absorption capabilities of the conventional pixel structure.

Therefore, there is a need for an improved absorber that overcomes the problems noted above and others previously experienced for bolometers. In particular, there is a need for a bolometer that has an absorber with a high resistivity and increased absorption capabilities to effectively absorb substantially all incident radiation

SUMMARY OF THE INVENTION

In accordance with infrared imagers and thermal detectors consistent with the present invention, an improved bolometer comprising an absorbing layer having one or more recesses or channels therethrough to increase the resistivity and absorption capability of the absorbing layer.

In addition, in accordance with systems consistent with the present invention, a pixel structure is provided for use in an infrared imager. The pixel structure comprises a substrate and a bolometer. The bolometer comprises a transducer and an absorber. The transducer has a spaced apart relationship with respect to the substrate and has an electrical resistance that varies in response to changes in the temperature of the transducer. The absorber has a spaced apart relationship with respect to the transducer and a thermal connection to the transducer permitting radiation absorbed by the absorber to heat the transducer. The absorber has a top side defining a recess in the absorber. The recess is adapted to affect the propagation path of a portion of radiation received by the absorber such that the radiation portion is absorbed by the absorber rather than exiting the absorber.

In addition, in accordance with systems consistent with the present invention, another pixel structure is provided for use in an infrared imager. The pixel structure comprises a substrate and a bolometer. The bolometer comprises a transducer and an absorber. The transducer has a spaced apart relationship with respect to the substrate and has an electrical resistance that varies in response to changes in the temperature of the transducer. The absorber has a spaced apart relationship with respect to the transducer and a thermal connection to the transducer permitting radiation absorbed by the absorber to heat the transducer. The absorber has a top side defining a recess in the absorber. The recess is adapted to decrease the thermal mass of the absorber such that the reduction in thermal mass results in a faster thermal time constant for the bolometer.

Other systems, methods, features, and advantages of the present invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The accompanying drawings, which are incorporated in and constitute a part of this specification, illustrate an implementation of the present invention and, together with the description, serve to explain the advantages and principles of the invention. In the drawings.

DETAILED DESCRIPTION OF THE INVENTION

Reference will now be made in detail to an implementation in accordance with methods, systems, and products consistent with the present invention as illustrated in the accompanying drawings. The present invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figures 1, 2, 3:
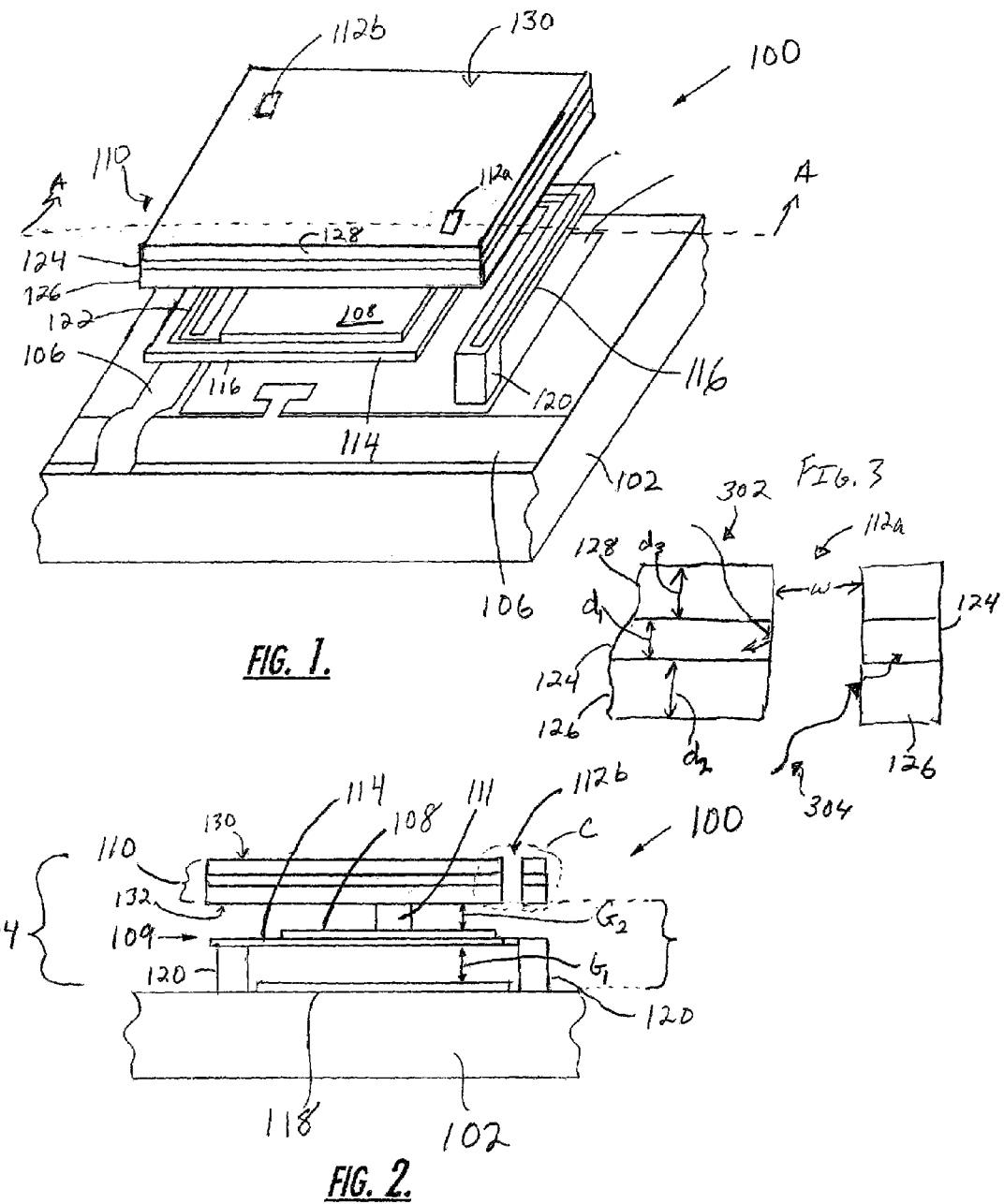
FIG. 1 is a perspective view of an exemplary pixel structure of a focal plane array consistent with the present invention.
FIG. 2 is a side elevation cross sectional view of the pixel structure along the line A-A indicated in FIG. 1.
FIG. 3 is an exemplary expanded tear away view of a section of the pixel structure referenced as C in FIG. 2, where the pixel structure section depicts a recess or channel formed in an absorbing layer of the pixel structure in accordance with the present invention.

FIG. 1 is a perspective view of one embodiment of a pixel structure 100 consistent with the present invention. FIG. 2 illustrates a side elevation cross sectional view of the pixel structure 100. As shown, the pixel structure 100 includes a substrate 102 and a bolometer 104 disposed upon the substrate. As known to those of ordinary skill in the art, a focal plane array typically includes an array of pixel structures for use in an imaging device, such as an uncooled infrared detector. Although the array may have different sizes, such as 320 rows by 240 columns, the focal plane array of one common example includes an array of pixel structures arranged in 640 rows and 480 columns. For purposes of illustration, however, a single pixel structure is depicted with the understanding that the other pixel structures of the focal plane array may be constructed in a like fashion.

Although not illustrated, the focal plane array for an infrared detector is typically disposed within a housing that is sealed to establish a vacuum chamber. The housing typically includes a window formed of a material that is transparent to infrared radiation such that infrared radiation incident upon the housing can be sensed by one or more pixel structures of the focal plane array. See, for example, U.S. patent application Ser. No. 09/113,472, filed Jul. 10, 1998 and entitled Sealed-Cavity Microstructure and Microbolometer and Associated Fabrication Methods that describes housings and techniques for sealing the housings in which focal plane arrays are disposed, the contents of which are incorporated herein by reference.

The substrate 102 is a microelectronic substrate and, as such, is typically formed of silicon although other materials may be utilized. Circuitry is typically formed on or below the surface of the substrate in a manner known to those of ordinary skill in the art in order to properly provide signals to and process signals that are received from the respective pixel structures, thereby permitting each pixel structure to be interrogated to determine the radiation incident thereupon. As shown in FIG. 1 in conjunction with an embodiment in which the focal plane array includes an array of pixel structures 100, the circuitry preferably includes row and column select elements 106 for permitting individual ones of the pixel structures to be addressed. As known to those skilled in the art, the circuitry can also include other circuitry disposed upon the substrate in electrical communication with the row and/or column select elements for processing the signals transmitted to or received from the respective pixel structure.

The bolometer 106 includes a transducer 108 having a spaced apart relationship with respect to the substrate 102 and an absorber 110 supported in a spaced apart relationship with respect to both the substrate and the transducer. The absorber has a thermal connection (e.g., via a post 111 in FIGS. 1-2) to the transducer permitting radiation absorbed by the absorber to heat the transducer. Since the absorber 110 is spaced from the transducer 108, the characteristics of the transducer and the absorber may be individually optimized. For example, the absorption characteristics of the absorber may be maximized in order to increase the responsiveness of the respective pixel structure. As further described herein, the absorber 110 has one or more recesses or channels (e.g., 112a and 112b) in the absorber 110 that effectively increase the resistivity, sheet resistance, and absorption capability of the absorber 110.

The transducer 108 is formed of a material having an electrical resistance that varies in response to changes in its temperature. For example, the transducer 108 may be formed of vanadium oxide $VO_x$, Titanium Oxide $TiO_x$, or other material that has an electrical resistance that predictably varies in a significant manner in response to changes in its temperature. The transducer 108 may be disposed upon an insulating layer 114 that serves to protect and support the transducer 108. While the material that forms the insulating layer is electrically insulating, the material is also preferably selected and the insulating layer is preferably shaped so as to assist in thermally isolating the transducer from the substrate 102, thereby reducing the thermal loss to the substrate. The insulating layer 114 may be formed of silicon dioxide $SiO_2$ or other insulating material that is shaped to define a pair of legs 116 having a meandering pattern in order to increase the thermal isolation of the transducer 108. For example, U.S. Pat. No. 6,307,194 describes the formation of a pair of legs 116 having a meandering pattern to support a transducer above a substrate, the contents of which are incorporated herein by reference. Although not illustrated, the transducer 108 may also be covered with a protective layer, such as another insulating layer formed of silicon dioxide layer, a nitride layer, or a polymide passivation layer. For purposes of description, the transducer 108 element as well as the surrounding insulating layers will collectively be referenced as the transducer layer 109.

As shown in FIG. 2, the bolometer 104 may also include a reflector 118 disposed over or on the substrate 102 and below the transducer 108 such that the reflector 118 also underlies at least a portion of the absorber 110. For example, after the circuitry has been formed upon the substrate 102, such as upon receipt of the substrate from an IC foundry, a layer of metal is patterned on the surface to be the reflector. This layer defines the bottom side of the optical cavity for absorption. The top side of the cavity is defined by the absorber 110 formed later in the fabrication process as described in further detail herein. The reflector 118 may be formed from a variety of materials, such as aluminum or titanium.

As shown in FIG. 2, the transducer layer 109 is spaced from the underlying substrate 102, by a gap $G_1$. While the gap $G_1$ may have different sizes without departing from the spirit and scope of the present invention, the gap is preferably within a range of 0.8 to 1.2 microns. The absorber 110, in turn, is spaced at a predetermined distance from the transducer layer 109. In one implementation, the absorber 110 is spaced by a gap $G_2$ that is within a range of 0.8 to 2.4 microns from the transducer layer 109. The combined thickness $G_3$ of the two gaps, $G_1+G_2$ has a combined spacing at about a quarter of the wavelength of the radiation that the absorber 110 is designed to preferentially absorb, such as about 2 to 3.5 microns for an absorber designed to preferentially absorb infrared radiation having a wavelength of 8 to 14 microns.

The transducer layer 109 may be spaced from the substrate 102 in a variety of manners. For example, the insulating layer 114 may include a pair of legs 116 that are angled or sloped downwardly to the substrate 102. Alternatively, the legs 116 of the bolometer may extend as shown in FIG. 1 to respective pillars 120 that extend outwardly in an orthogonal manner from the substrate 102 so as to support the transducer layer 109 above the substrate 102. Like the transducer layer, the pillars 120 are typically a composite structure formed of an electrically conductive material, such as Chromium or Nickel-Chromium (commonly known as Nichrome or NiCr), extending through an electrically insulating material, such as $SiO_2$, in order to provide electrical contact between the transducer 108 element and circuitry disposed upon the substrate 102. By thermally isolating the transducer 108 element from the substrate, the thermal loss from the bolometer to the substrate is reduced.

The bolometer further includes conductive traces 122 that extend from the transducer element 108 to respective ones of the pillars 120 and, more particularly, to the electrically conductive portion of each pillar, thereby electrically connecting the transducer element to the circuitry disposed upon the substrate 102. As described above in conjunction with the transducer element, the conductive traces are generally deposited upon the insulating layer 114 and, although not illustrated, the conductive traces can also be covered with another insulating layer in order to protect the conductive traces and the signals propagating therealong. As described below, the conductive traces are more preferably deposited upon the meandering legs 116 of the insulating layer 114 in order to extend from the transducer 108 element to the respective pillars 120. As explained below, the circuitry can therefore be controlled to pass current through the transducer 108 element such that the resistance of the transducer element can be correspondingly monitored, thereby providing a measure of the radiation incident upon the bolometer.

As previously noted, the absorber 110 is spaced from the transducer layer 109 by means of one or more posts 111, which operate as a thermal connection between the absorber 110 and the transducer 108. The one or more posts 111 also enable the absorber to cover the transducer in an umbrella type configuration. In the implementation shown in FIG. 2, the bolometer includes a single post 111 extending outwardly from the transducer 108 element in order to support a central portion of the absorber 110 in a spaced apart relationship with respect to the transducer 108. However, in an alternative implementation, the bolometer 104 may employ one or more posts 111 positioned at locations other than a central portion of the absorber 110. Each post 111 is formed of a conductive material. In one implementation, east post 111 is formed of silicon dioxide $SiO_2$, which may also be used to form the insulating layer 114 covering the transducer. However, in this implementation, each post 111 has a size and shape that permits heat to be efficiently transferred from the absorber 110 to the transducer 108 element. Conversely, the legs 116 of the insulating layer 114 have a size and shape that effectively limits heat transmission between the transducer element and the substrate 102. In this regard, the length of the respective post 111 is generally much smaller than the width of the post such that the post is quite thermally conductive. For example, while each post 111 can have a variety of sizes, in one implementation the post has a length that is equal to or less than about 1 micron and a width that is equal to or greater than 4 microns. In contrast, the length of each leg of the insulating layer is many times greater than the respective width. While multiple posts can be utilized to support the absorber in a spaced apart relationship with respect to the transducer layer, the overall thermal mass of the post(s) is preferably relatively small with respect to the absorber and the transducer in order to permit the time constant of the bolometer to also be relatively small. The thermal mass of the absorber 110 and of the transducer layer 109 should also be small to produce a faster thermal time constant. The thermal time constant is defined as the thermal mass of the pixel divided by the thermal conduction of the pixel. Thus, a reduction in the thermal mass leads directly to a smaller/faster thermal time constant. As described in further detail below, a recess or channel 112a or 112b in the absorber 110 advantageously contributes to a reduction of thermal mass and therefore to a smaller/faster thermal time constant for the bolometer 104.

As shown in FIGS. 1-2, the absorber 110 comprises an absorbing layer 124 formed of a material that is strongly absorptive of radiation of a predetermined wavelength or wavelength range of interest, such as infrared radiation having a wavelength of 8 to 14 microns. For example, the absorbing layer 124 may be formed of Nichrome (NiCr) or other highly resistive alloy or metal. In addition, to increase the sheet resistance of the absorber and enhance the absorption capability of the absorbing layer 124, the absorbing layer 124 is formed to have a thickness (e.g., referenced as "$d_1$" in FIG. 3) that is less than 100 Angstroms and preferably within a range of 15 to 50 Angstroms. The effect of the thickness ($d_1$) of the absorbing layer 124 on the sheet resistance (Rs) of absorbing layer 124 is described below. The resistance (R) of the absorbing layer 124 is reflected in equation 1:

$$R = Rho * L/A \quad (1)$$

where Rho is the resistivity of the absorbing layer 124 and L and A are its length and cross-sectional area, respectively. If W is the width of the absorbing layer 124 and $d_1$ is its thickness (i.e. $-A=Wt$), then the resistance may be represented as shown in equation 2:

$$R = (Rho/d_1)(L/W) = Rs(L/W) \quad (2)$$

where $Rs=Rho/d_1$ is the sheet resistance of the absorbing layer 124 layer. Since L/W is unitless and resistance R is expressed in ohms, to avoid confusion between resistance R and sheet resistance Rs of a layer, sheet resistance Rs is commonly specified in unit of "ohms per square" and the L/W ratio is references as the number of unit squares (of any size) of material in the resistor. Accordingly, the sheet resistance (Rs) of absorbing layer 124 may be increased regardless of the cross sectional area or size of the absorbing layer 124 by forming the absorbing layer 124 to be as thin as possible using known deposition techniques. In one implementation in which the absorbing layer 124 is formed of NiCr to have a thickness of 100 Angstroms, the absorbing layer 124 has a sheet resistance of 100 ohms per square. In another implementation in which the absorbing layer 124 is formed of NiCr to have a thickness of 50 Angstroms, the absorbing layer 124 has a sheet resistance of approximately 400 ohms per square.

However, when the absorbing layer 124 is formed of highly resistive alloy or metal material (such as NiCr) to have a thickness of 100 Angstroms or less, the absorbing layer 124 becomes less rigid and may require a base supporting layer to maintain the gap $G_2$ between the absorber 110 and the transducer 108. Accordingly, the absorber 110 may include a base layer 126 upon which the absorbing layer 124 is formed. In this implementation, the base layer 126 is formed on the post 111. The base layer 126 is formed of a lightweight, rigid material (such as silicon oxide $SiO_x$, or silicon nitride $Si_xN_y$) that maintains its shape at a relatively thin thickness (e.g., "$d_2$" in FIG. 3) such that the base layer 126 maintains the spatial relationship (e.g., gap $G_2$) between the absorber 110 and the transducer layer 109. In one implementation, when the absorbing layer 124 is formed to have a thickness d1 that is equal to or less than 100 Angstroms, the base layer 126 of the absorber 110 is formed of $SiO_x$, to have a thickness that is equal to or greater than 1000 Angrstoms.

As shown in FIGS. 1-3, the absorber 110 may also comprise a protective layer 128 formed over the absorbing layer 124 such that the absorbing layer 124 is sandwiched between the base layer 126 and the protective layer 128. The protective layer 128 may be formed of $SiO_x$, $Si_xN_y$, or other passivation type material. In one implementation, when the absorbing layer 124 is formed to have a thickness $d_1$ that is equal to or less than 100 Angstroms, the base layer 126 of the absorber 110 is formed of $SiO_x$ to have a thickness $d_3$ that is equal to or greater than 400 Angstroms.

Note in FIGS. 1-3, the base layer thickness $d_2$, the absorbing layer thickness $d_1$ and the protective layer thickness $d_3$ are not drawn to scale. While the absorbing layer has a substantially smaller thickness than either the base layer or the protective layer, for purposes of illustration, the absorbing layer thickness is depicted as being visibly discernable from the base layer and the protective layer.

As previously discussed, a significant portion (e.g., 20% or more) of infrared radiation that is incident upon a conventional bolometer passes through and is not absorbed by the absorber element. The reflector in the bolometer reflects the unabsorbed radiation portion back towards the absorber element. However, a significant portion (e.g., 20% or more) of the reflected radiation is not absorbed by the conventional bolometer's absorber element during its second pass through the absorber element but passes through and exits out of the absorber element.

In accordance with the present invention, the absorbing layer 124 of the bolometer 104 is formed of highly resistive alloy or metal material (such as NiCr) to have a thickness $d_1$ of 100 Angstroms or less, which significantly improves the absorption capability of the bolometer 104 over conventional bolometers such that the bolometer 104 absorbs more radiation incident upon a top side 130 of the bolometer 104 and more radiation reflected back to the bolometer 104 via the reflector 118. However, the absorbing layer 124 of the bolometer 104 may still allow a portion (e.g., less than 20%) of reflected radiation to pass through and exit the absorbing layer 124 without being absorbed.

Accordingly, to improve the sheet resistance and absorption capability of the absorber 110, the absorber 110 is formed to have one or more recesses or channels 112a and 112b defined by or in the top side of the absorber 110 as shown in FIGS. 1-3. Each recess or channel 112a and 112b is adapted to affect the propagation path of a portion of radiation received by the absorber such that the radiation portion is absorbed by the absorber 110 rather than exiting the absorber 110. Each recess or channel 112a and 112b has a width or characteristic length (w) that is smaller than a predetermined wavelength or range of wavelengths (e.g., infrared wavelength band 8 to 14 microns) associated with the radiation portion to be absorbed by the absorbing layer 124. In one implementation, each recess or channel 112a and 112b is formed to have a width or characteristic length (w) that is within a range of 1.4 microns to 3 microns such that the absorber 110 is adapted to effect the propagation path of radiation received by the absorber 110 that has a wavelength equal to or greater than 3 microns and, thus, those wavelengths that are in the infrared band of 8 to 14 microns.

As shown in FIG. 3, a portion of radiation 302 that is incident upon the top side 130 of the absorbing layer 124 and that has a wavelength greater than the width (w) of the recess or channel 112a may propagate in a path to the recess or channel 112a. Since the recess or channel 112a has width or characteristic length (w) that is smaller than the wavelength of the incident radiation 302, the propagation path of the incident radiation 302 is altered or redirected to allow the absorbing layer 124 to absorb this radiation portion 302 rather than exit the absorber 110. In addition, as depicted in FIG. 3, each recess or channel 112a and 112b may be disposed in the absorber 110 relative to the reflector 118 such that the respective recess 112a and 112b effects the propagation path of radiation 304 reflected by the reflector 118 towards the absorber 110 so that the reflected radiation 110 is absorbed by the absorbing layer 124 rather than exiting the absorber 110.

The shape of the recess or channel 112a or 112b may be a square, trapezoidal, rectangular, circular or other shape having a width or characteristic length (w) that may be sized to be less than a predetermined wavelength or range of wavelengths of interest. The characteristic length for a circular shaped recess or channel 112a or 112b, for example, is its diameter. Although the absorbing layer 124 is depicted as having channels 112a and 112b formed as a respective passageway through the top side 130 and a bottom side 132 of the absorber 110, the channels 112a and 112b may be formed as recesses in either the top side 130 or bottom side 132 of the absorber 110 without forming a passageway to the other side 132 or 130. The recesses or channels 112a or 112b may be formed in the absorber 110 using known photolithographical patterning and etching techniques.

An additional advantage of increased sheet resistance (Rs) of the absorbing layer 124 is achieved by selectively removing the base layer material (e.g., $SiO_x$) and/or the protective layer material (e.g., $SiO_x$) as well as the absorbing layer 124 material (e.g., NiCr) to form the recesses or channels 112a and 112b. Once the absorbing layer 124 is deposited or formed to a predetermined thickness $d_2$, the sheet resistance (Rs=Rho/$d_1$) is increased by reducing the percentage of remaining material density of the absorber 110 as reflected in equation 3:

$$Rs \text{ with channels} = (Rs \text{ without channels})/(\% \text{ of remaining material density}) \quad (3)$$

For example, in one implementation of the bolometer 104 as further discussed below, the absorbing layer 124 was formed to a thickness $d_1$ corresponding to 350 ohms per square before forming channels 112a and 112b. In this implementation, a plurality of channels 112a and 112b were formed about a center of the absorber 110 such that the percentage of the remaining material density or volume of the absorber 110 was one half (½) or 50 percent. The percentage of channel density or volume of the absorber 110 was a corresponding one half (½) or 50 percent. The sheet resistance Rs with the channels 112a and 112b was increased to 700 ohms per square in accordance with equation 3 and shown below:

$Rs$ with channels(700 ohms per square)=$Rs$ without channels(350 ohms per square)/50% remaining material density To measure the increased absorption capacity of a bolometer formed in accordance with the present invention versus a prior art bolometer, four different pixel structures having four different bolometers were fabricated and tested under the same radiation conditions. The first pixel structure (not shown in the figures) was fabricated to have a conventional bolometer structure as disclosed in FIGS. 1-2 of U.S. Pat. No. 6,307,194. The conventional bolometer was formed to have an absorbing layer of NiCr with a thickness of 100 Angstroms, which corresponds to a sheet resistance (Rs) of 200 ohms per square.

Figure 4:
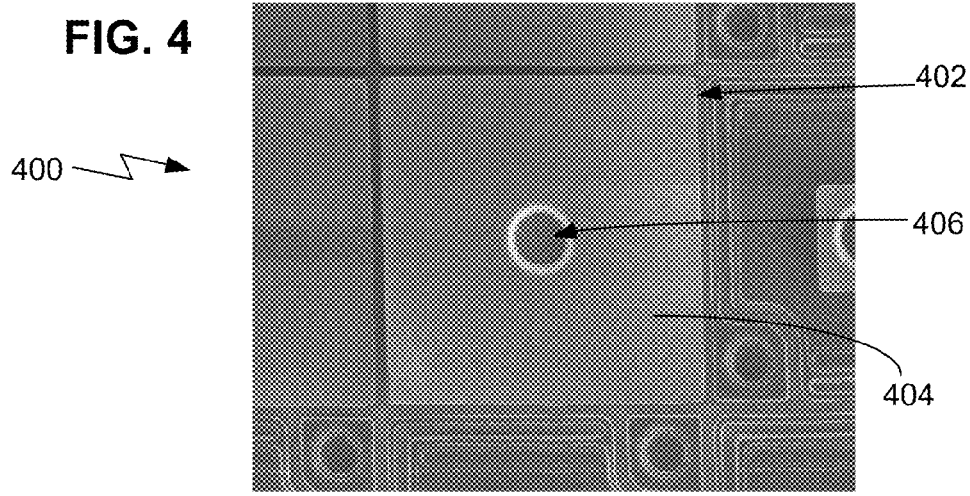
FIG. 4 depicts a top level view of the layout of a pixel structure having a bolometer with an absorber formed in accordance with the present invention, where the absorber is formed without a recess or channel.

FIG. 4 depicts a top level view of the layout of the second pixel structure 400 fabricated and tested. The second pixel structure 400 was fabricated in accordance with the present invention to have a bolometer 402 consistent with the bolometer 104 of the pixel structure 100, except the absorber 404 (top side in view in FIG. 4) of the bolometer 402 was formed without a recess or channel 112a or 112b. The post 406 (consistent with the post 111) of the bolometer 402 is shown through the absorber 404 in FIG. 4, but is not a recess or channel of the absorber 404. The absorber 404 was formed to have an absorbing layer of NiCr with a thickness of approximately 57 Angstroms, which corresponds to a sheet resistance (Rs) of 350 ohms per square.

Figure 5:
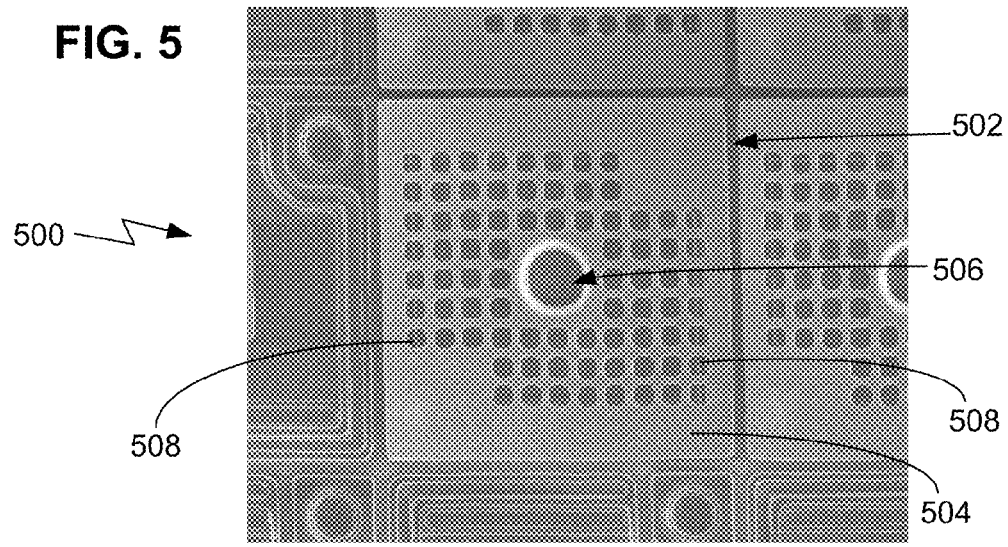
FIG. 5 depicts a top level view of the layout of a pixel structure having a bolometer with an absorber formed in accordance with the present invention, where the absorber is formed to have a first predetermined number of channels formed therethrough.

FIG. 5 depicts a top level view of the layout of the third pixel structure 500 fabricated and tested. The third pixel structure 500 was fabricated in accordance with the present invention to have a bolometer 502 consistent with the bolometer 104 of the pixel structure 100, where the absorber 504 of the bolometer 502 was formed to have seventy-eight (78) channels 508 (consistent with channels 112a and 112b) formed in or therethrough. The channels 508 were formed about a center of the absorber 504. Each of the channels 508 were formed to have a width or characteristic length (w) of approximately 1.4 microns, which is less than the predetermined wavelength of 8 micron associated with the beginning of the infrared radiation band (e.g., 8-14 microns). The post 506 (consistent with the post 111) of the bolometer 502 reflects the center position of the absorber 504. The post 506 of the bolometer 502 is shown through the absorber 504 in FIG. 5, but is not a recess or channel of the absorber 504. The absorber 504 was formed to have an absorbing layer of NiCr with a thickness of approximately 57 Angstroms, which corresponds to a sheet resistance (Rs) of 350 ohms per square before the 78 channels were formed in the absorber 504. As shown in FIG. 5, the channels 508 collectively displace approximately a third of a volume of the absorber 504 such that approximately two thirds of the absorber 504 material remains, resulting in an increase of sheet resistance from 350 ohms per square to approximately 525 ohms per square overall, or 700 ohms per square within close proximity of the channels in accordance with the present invention.

Figure 6:
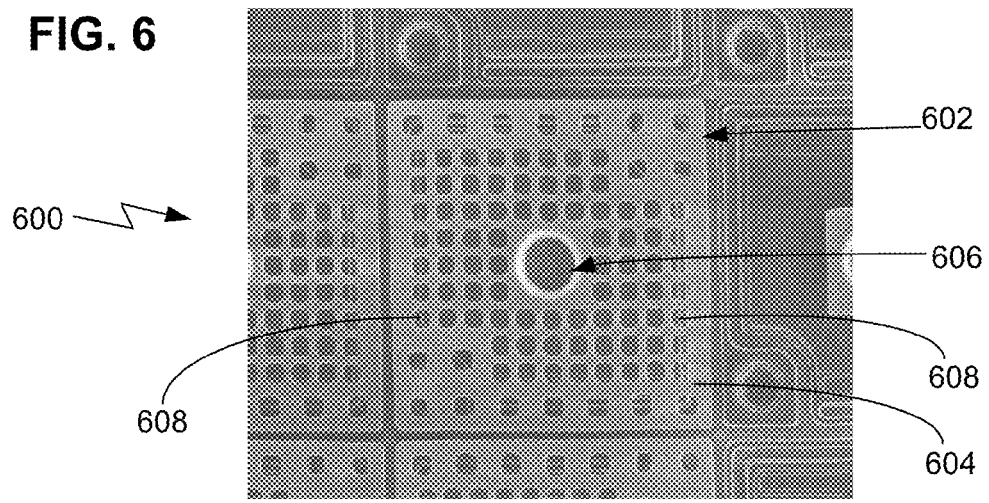
FIG. 6 depicts a top level view of the layout of a pixel structure having a bolometer with an absorber formed in accordance with the present invention, where the absorber is formed to have a second predetermined number of channels formed therethrough and the second number of channels is greater than the first number of channels.

FIG. 6 depicts a top level view of the layout of the fourth pixel structure 600 fabricated and tested. The fourth pixel structure 600 was fabricated in accordance with the present invention to have a bolometer 602 consistent with the bolometer 104 of the pixel structure 100, where the absorber 604 of the bolometer 602 was formed to have one hundred and three (103) channels 608 (consistent with channels 112a and 112b) formed in or therethrough. The channels 608 were formed about a center of the absorber 604. Each of the channels 608 were formed to have a width or characteristic length (w) of approximately 1.4 microns, which as previously noted is less than the predetermined wavelength of 8 micron associated with the beginning of the infrared radiation band (e.g., 8-14 microns). The post 606 (consistent with the post 111) of the bolometer 602 reflects the center position of the absorber 604. Although the post 606 of the bolometer 602 is visible through the absorber 604 in FIG. 6, the post 606 is not a recess or channel of the absorber 604. The absorber 604 was formed to have an absorbing layer of NiCr with a thickness of approximately 57 Angstroms, which corresponds to a sheet resistance (Rs) of 350 ohms per square before the 103 channels were formed in the absorber 604. As shown in FIG. 6, the channels 608 collectively displace approximately one-half of the volume of the absorber 604 such that approximately half of the absorber 604 material remains, resulting in an increase of sheet resistance from 350 ohms per square to approximately 700 ohms per square in accordance with the present invention. Although not shown in the figures, the umbrella structure of an absorber formed in accordance with the present invention may have a sheet resistance of approximately 1000 ohms per square when the absorbing layer has a thickness (d1) of approximately 100 Angstroms or less, the base layer has a thickness (d2) of approximately 900 Angstroms or greater, the protective layer has a thickness (d3) of approximately 400 Angstroms or greater and the absorbing layer is formed to have a channel density of four-fifths or less (i.e., so the remaining absorbing layer material density is one-fifth or more) based on the thickness of the absorbing layer.

Figure 7:
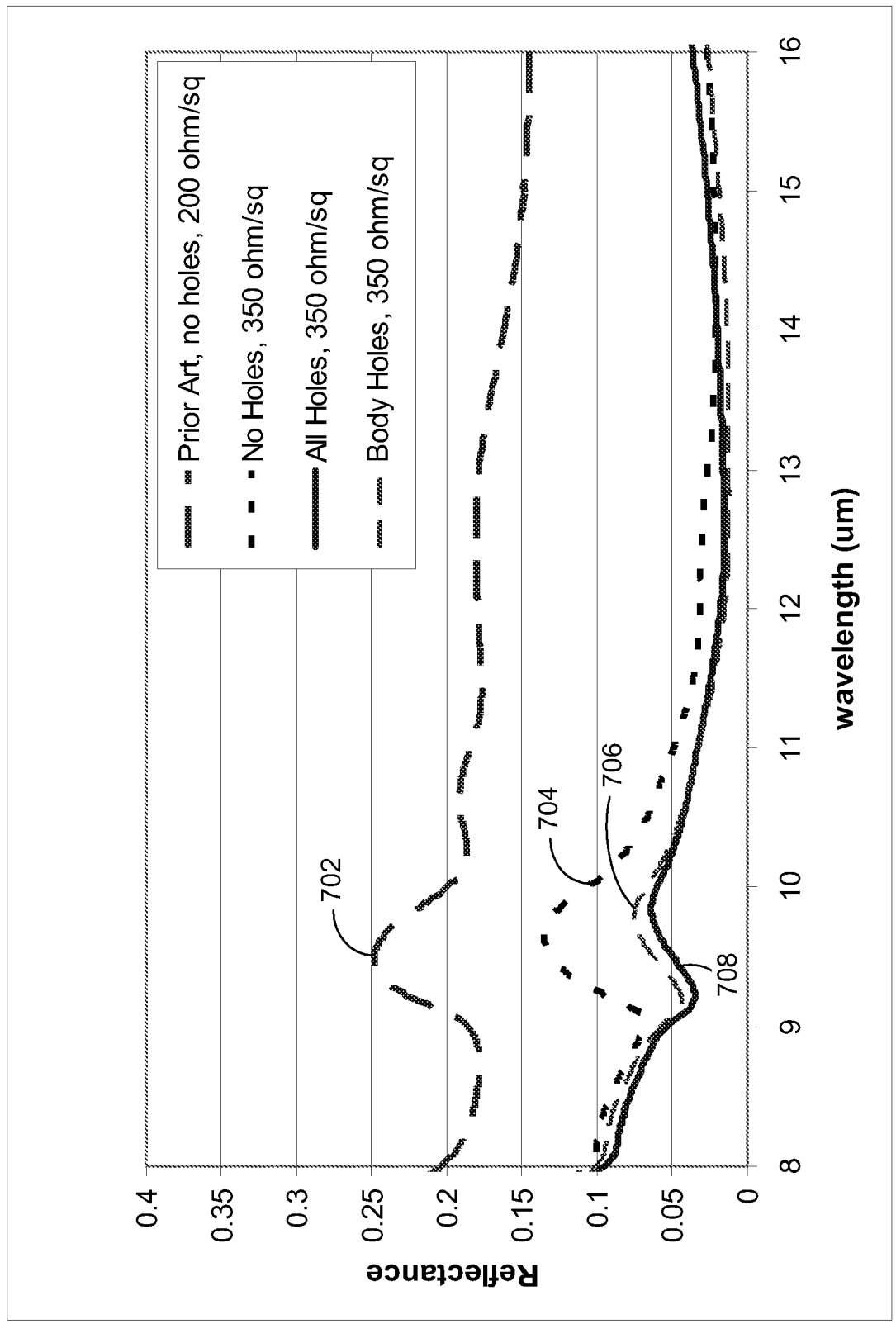
FIG. 7 is a graph depicting the percentage of radiation reflected (or not absorbed) versus radiation wavelength for a prior art bolometer, the bolometer of FIG. 4, the bolometer of FIG. 5 and the bolometer of FIG. 6.

Each absorber (e.g., the prior art absorber and the absorbers 404, 504 and 604) of the four different pixel structures was radiated with the same level of radiation for wavelengths from 8 to 16 microns. The amount of radiation reflected by the respective absorber was measured for each radiation wavelength and separately plotted in the graph depicted in FIG. 7. Note the measured reflected radiation represents the radiation that was not absorbed by the respective absorber either when the radiation initially passed though the absorber or after being reflected by the reflector implemented in the respective bolometer. A reflectance of "0" in FIG. 7 represents no radiation exited the absorber or, in other words, 100% of the radiation was absorbed by the absorber. Conversely, a reflectance of "1" (not shown in FIG. 7) indicates that all of the radiation was reflected by the absorber or, in other words, 0% of the radiation was absorbed by the absorber.

As shown in FIG. 7, the plot 702 of the portion of radiation reflected (rather than absorbed) by the absorber of the conventional bolometer discussed above is approximately 20% or more than the plots 704, 706 and 708 of the respective portion of radiation reflected (rather than absorbed) by the bolometers 402, 502 and 602 fabricated in accordance with the present invention. The difference in absorption capability between the absorber of the conventional bolometer and the absorber 402 with no recesses or channels in or therethrough is attributable to the difference in structure of the respective absorbers and the difference in thickness of the respective absorbing layers.

The plot 704 of the portion of radiation reflected (rather than absorbed) by the absorber of the bolometer 402 with no recesses or channels in or therethrough is significantly higher than the plots 706 and 708 of the respective portion of radiation reflected (rather than absorbed) by the bolometers 502 and 602 fabricated in accordance with the present invention to have channels 508 and 608, especially within the wavelength range of 9 to 10 microns. The difference in absorption capability between the absorber 404 of the bolometer 402 and each of the absorbers 504 or 604 is attributable to the recesses or channels 508 or 608 formed in the respective absorbers 504 or 604. The recesses or channels 508 or 608 each have a width or characteristic length (w) that is smaller than 8 microns or smaller than any of the radiation wavelengths in the band of 8-16 micron wavelengths used to test the absorbers as shown in FIG. 7. Thus, the recesses or channels 508 or 608 were able to refract or effect the propagation path of a substantial portion (e.g., approximately 95% on average) of radiation received by the absorber 504 and 604 such that the radiation portion is absorbed by the absorber rather than allowed to exit the absorber. In the range of 9 to 10 microns, the effect of the recesses or channels 508 and 608 is even more substantial. The oxide material used to form the base layer and protective layer for the absorber 404 without recesses or channels impacts the ability of a portion of the radiation within the range of 9 to 10 microns incident on the absorber 404 from reaching and, thus, being absorbed by the absorber's 404 absorbing layer. Since one third or more of the base layer and protective layer is removed or displaced by the channels 508 or 608 of the absorber 504 or 604, the remaining base layer material and protective layer material of the absorber 504 or 604 has less of an affect on the ability of 9 to 10 micron wavelengths to reach the absorbing layer due to the channels 508 and 608. The channels 508 and 608 also significantly decrease the thermal mass of the absorber, enabling the respective bolometer 502 or 602 to have a faster thermal time constant.

In addition, the plot 706 of the portion of radiation reflected (rather than absorbed) by the absorber 504 of the bolometer 502 with a first predetermined number of channels 508 (i.e., 78 channels) is also measurably higher than the plot 708 of the respective portion of radiation reflected (rather than absorbed) by absorber 604 of the bolometer 602 with a second predetermined number of channels 608 (i.e., 103 channels). Thus, an increase in channel density and reduction in the density of remaining absorber material (e.g., further reduction in base layer and protective layer) results in further increase in absorption capability as well as sheet resistance of an absorber (e.g., absorber 604) fabricated in accordance with the present invention.

While various embodiments of the present invention have been described, it will be apparent to those of skill in the art that many more embodiments and implementations are possible that are within the scope of this invention. Accordingly, the present invention is not to be restricted except in light of the attached claims and their equivalents.

What is claimed is:

1. A pixel structure for use in an infrared imager, comprising:
   a substrate; and
   a bolometer comprising:
   a transducer having a spaced apart relationship with respect to said substrate, the transducer having an electrical resistance that varies in response to changes in the temperature of the transducer, and
   an absorber having a spaced apart relationship with respect to the transducer, the absorber having a thermal connection to the transducer permitting radiation absorbed by the absorber to heat the transducer, the absorber including an absorbing layer having a thickness that is 100 Angstroms or less, the absorber further including a base layer disposed below the absorbing layer and having a thickness equal to or greater than 900 Angstroms,
   wherein the absorber has a top side defining a channel through the absorber, the channel being adapted to affect the propagation path of a portion of radiation received by the absorber such that the radiation portion is absorbed by the absorber rather than exiting the absorber.

2. A pixel structure according to claim 1, wherein radiation portion corresponds to a predetermined wavelength and the channel has a width that is smaller than the predetermined wavelength.

3. A pixel structure according to claim 1, wherein the bolometer further comprises a reflector disposed over the substrate and below the transducer, wherein the channel is disposed relative to the reflector such that the channel effects the propagation path of radiation reflected by the reflector towards the absorber so that the reflected radiation is absorbed by the absorber rather than exiting the absorber.

4. A pixel structure according to claim 1, wherein the channel effectively increases the resistivity of the absorber to a predetermined level.

5. A pixel structure according to claim 1, wherein the absorber covers the transducer in an umbrella type configuration.

6. A pixel structure according to claim 1, wherein the channel is one of a plurality of channels through the absorber.

7. A pixel structure according to claim 6, wherein the channels are spaced about a center of the absorber.

8. A pixel structure according to claim 1, wherein the thickness of the absorbing layer is in a range from 50 Angstroms to 100 Angstroms.

9. A pixel structure according to claim 1, wherein the channel is one of a plurality of channels through the absorber and spaced about the absorber such that the absorbing layer has a sheet resistance within the range of 350 ohms per square to 1000 ohms per square.

10. A pixel structure according to claim 1, wherein the channel is one of a plurality of channels through the absorber and the channels collectively displace a third or more of a volume of the absorbing layer.

11. A pixel structure according to claim 1, wherein the channel is one of a plurality of channels in the absorber and the collective density of the channels is selected such that the absorber has a sheet resistance that is equal to or greater than 400 ohms per square.

12. A pixel structure according to claim 1, wherein the bolometer further comprises a post extending between the transducer and the base layer of the absorber for supporting the absorber in the spaced apart relationship with the transducer.

13. A pixel structure according to claim 1, wherein the absorbing layer comprises NiCr.

14. A pixel structure for use in an infrared imager, comprising:
   a substrate; and
   a bolometer comprising:
   a transducer having a spaced apart relationship with respect to said substrate, the transducer having an electrical resistance that varies in response to changes in the temperature of the transducer, and
   an absorber having a spaced apart relationship with respect to the transducer, the absorber having a thermal connection to the transducer permitting radiation absorbed by the absorber to heat the transducer, the absorber including an absorbing layer having a thickness that is 100 Angstroms or less, the absorber further including a rigid base layer disposed below the absorbing layer and having a thickness equal to or greater than 900 Angstroms,
   wherein the absorber has a top side defining a channel through the absorber, the channel being adapted to decrease the thermal mass of the absorber.

15. The pixel structure of claim 14, wherein the reduction in thermal mass results in a faster thermal time constant for the bolometer.

* * * * *